United States Patent [19]

Blair

[11] Patent Number: 4,704,691

[45] Date of Patent: Nov. 3, 1987

[54] TRIGGER HOLDOFF SYSTEM FOR AN OSCILLOSCOPE

[75] Inventor: Bruce W. Blair, Beaverton, Oreg.

[73] Assignee: Tektronix, Inc., Beaverton, Oreg.

[21] Appl. No.: 928,609

[22] Filed: Nov. 3, 1986

Related U.S. Application Data

[63] Continuation of Ser. No. 647,003, Sep. 4, 1984, abandoned.

[51] Int. Cl.$^4$ .................. G01R 23/16; G01R 13/20; H03K 23/66
[52] U.S. Cl. ................... 364/487; 324/121 R; 377/110
[58] Field of Search .............. 364/484, 487, 521; 324/121 R; 328/15, 136, 150; 377/52, 53, 107, 110, 94, 95, 96, 49

[56] References Cited

U.S. PATENT DOCUMENTS 3,354,392 11/1967 Newell ........................ 324/121 R
3,474,235 10/1969 Singer ........................ 377/95 X
4,011,506 3/1977 Bowden ..................... 324/121 R
4,016,495 4/1977 Machanian ................. 377/110 X
4,084,082 4/1978 Alfke ........................... 377/110
4,086,580 4/1978 Schroeder ................... 377/53 X
4,254,327 3/1981 Beno et al. ................. 377/52 X
4,310,752 1/1982 Boyer et al. ................... 377/53

*Primary Examiner*—W. B. Perkey
*Attorney, Agent, or Firm*—George T. Noe

[57] ABSTRACT

A trigger holdoff system for an oscilloscope is provided in which a desired trigger signal is taken out from a repetitive group of raw trigger signals with variable time therebetween. A trigger generator generates raw triggers which clock a divide by N counter programmable by a microprocessor. When the counter reaches its terminal count, a trigger is passed on to sweep or acquisition circuits from the trigger holdoff system and an enable signal is set so that the next raw trigger reloads the counter.

3 Claims, 3 Drawing Figures

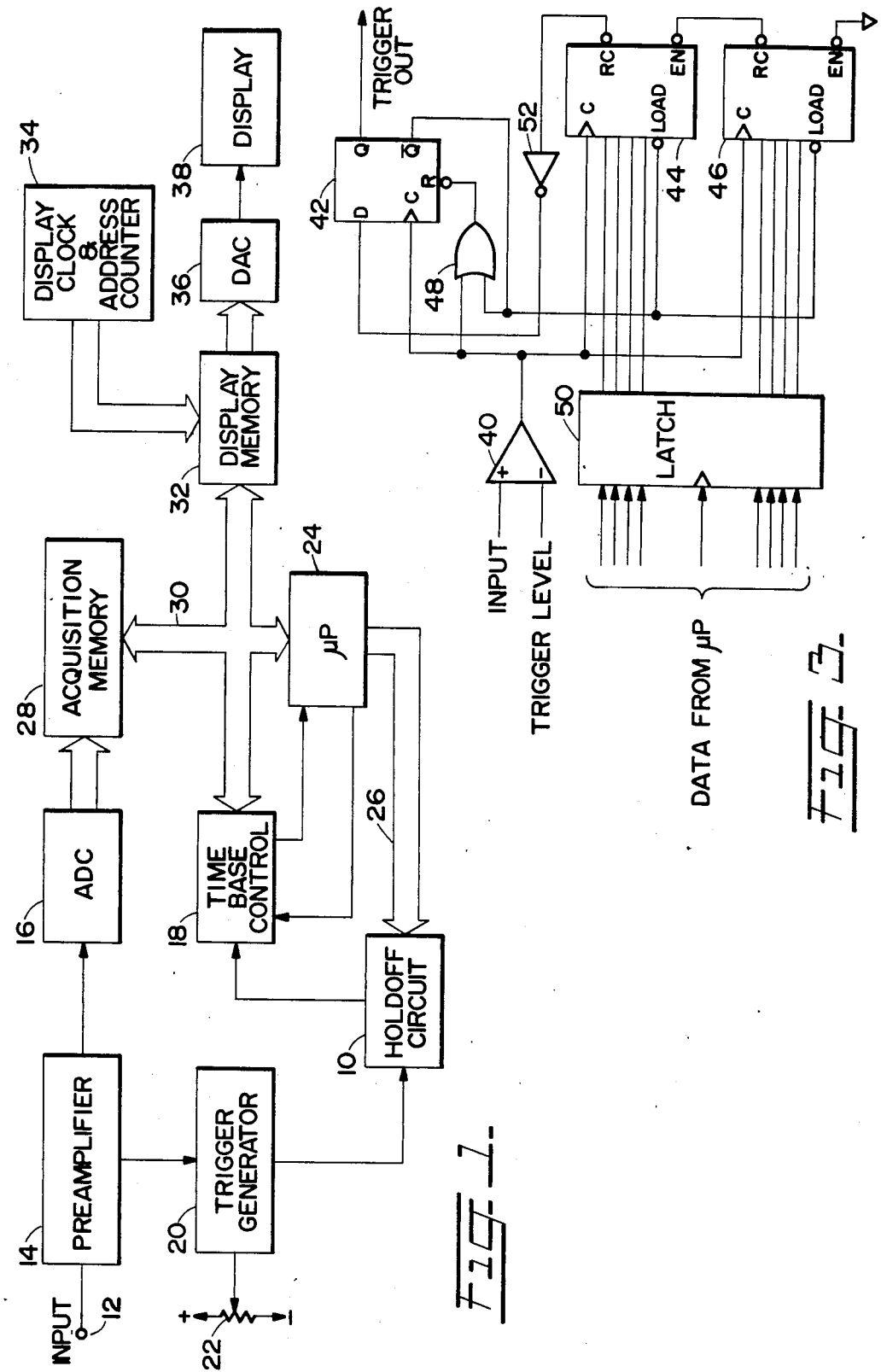

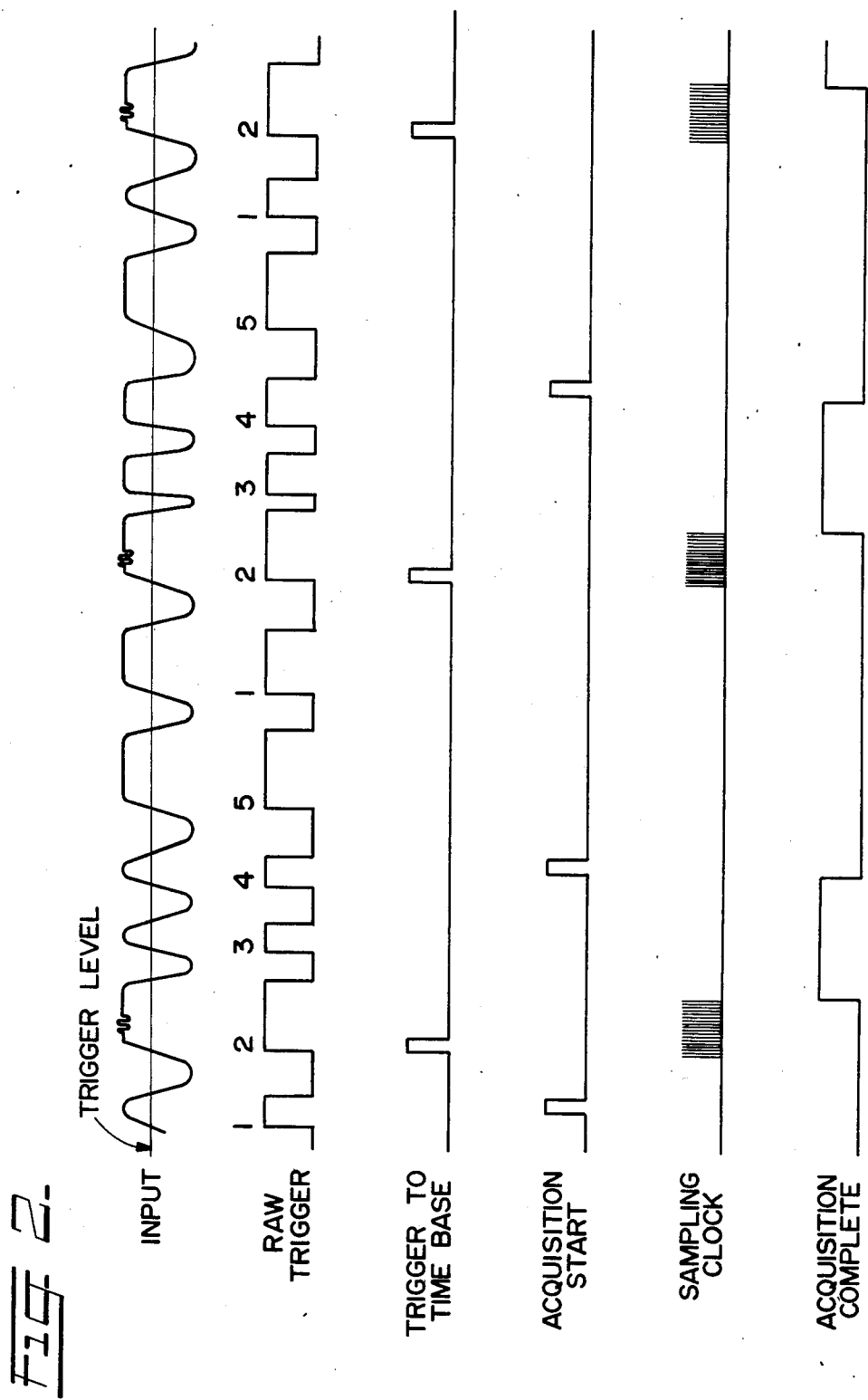

TRIGGER HOLDOFF SYSTEM FOR AN OSCILLOSCOPE

This is a continuation of application Ser. No. 647,003 filed Sept. 4, 1984, now abandoned.

BACKGROUND OF THE INVENTION

The present invention relates generally to a trigger holdoff system for an oscilloscope, and particularly to a trigger holdoff system for providing a stable trigger from a non-repetitive signal.

In conventional analog and digital oscilloscopes, an input signal is applied to a trigger generator, which generates a trigger signal in synchronism with the input signal. The trigger signal initiates a sweep generator to generate a sweep ramp signal in the analog oscilloscope or a time base control circuit to fill an acquisition memory in the digital oscilloscope. When monitoring a repetitive signal, a trigger holdoff circuit locks out the trigger signal from the sweep generator or the time base control circuit during a certain period of time to prevent premature starts of a new ramp excursion or a new acquisition cycle. Thus, the input signal is stably displayed on a screen or acquired into a memory in response to an identical trigger signal. However, the conventional trigger holdoff system functions properly only when the input signal is repetitive because the holdoff time period is fixed. That is, when the raw trigger signals are produced in groups of fixed numbers with variable time intervals therebetween, such as may be the output of a state machine, the timing of generation of a sweep ramp signal or an acquisition cycle is unstable.

SUMMARY OF THE INVENTION

In accordance with the present invention, a trigger holdoff system allows a desired trigger signal, among a repetitive group of raw trigger signals with variable time intervals therebetween, to be passed on to a sweep generator of an analog oscilloscope or an acquisition system of a digital oscilloscope. The holdoff circuit has a divide by N counter, in which N is programmable under microprocessor control. Each raw trigger from the trigger generator is counted by a counter. When the counter reaches its terminal count, an enable signal is set so that the next raw trigger resets the counter and a trigger is passed to the acquisition system of the digital oscilloscope or a sweep generator of the analog oscilloscope.

It is, therefore, a feature of the present invention to provide a stable trigger pulse from a group of raw triggers that repeat in a fixed pattern but shift in time.

It is another feature of the present invention to provide a stable trigger in applications, such as a microprocessor controlled system in which a fixed count loop is executing.

Other features and attainments of the present invention will become apparent to those skilled in the art upon a reading of the following detailed description when taken in conjunction with the drawings.

DRAWINGS

FIG. 1 is a block diagram of a digital oscilloscope employing a trigger holdoff system according to the present invention;

FIG. 2 is a waveform diagram to facilitate an understanding of the operation of the digital oscilloscope of FIG. 1; and FIG. 3 is a detailed schematic of one embodiment according to the present invention.

DETAILED DESCRIPTION OF THE INVENTION

Referring to the block diagram of FIG. 1, a digital oscilloscope employs trigger holdoff circuit 10 in accordance with the present invention. The operation of the embodiment of FIG. 1 will be described in conjunction with the waveform diagram of FIG. 2, which depicts the relationship between signals. An analog signal (INPUT) is applied via input terminal 12 to preamplifier 14, which suitably may be a conventional gain switching amplifier for amplifying and attenuating the input signal to a suitable level. The preamplified signal is applied to analog-to-digital converter (ADC) 16, which converts the instantaneous value of the analog signal to n-bit parallel digital data at a rate determined by a sampling clock applied from time base control 18.

The preamplified signal is also applied to trigger generator 20, which generates raw triggers (RAW TRIG) at a reference level preselected by trigger level potentiometer 22. It should be noted that the raw triggers need not be repetitive, but may be a logic pattern consisting of a fixed number of triggers with variable time intervals therebetween. However, let us suppose that the input signal has at least one particular event in each pattern to be monitored on a display device. Let us suppose also that the logic pattern comprises five triggers, for purposes of explanation. The operator should know the fixed number of triggers in the logic pattern as described hereinafter. The raw triggers are applied to holdoff circuit 10 which operates a divide by N counter. N corresponds to the fixed number of the raw triggers and is programmable under control of microprocessor 24 via bus 26. Accordingly, in this case, N is equal to five. When the counter reaches its terminal count, holdoff circuit 10 passes a trigger to time base control circuit 18, which also receives an acquisition start signal (ACQ START) from microprocessor 24 to enable control circuit 18. Simultaneously, an enable signal is set so that the next raw trigger reloads the counter.

Time base control circuit 18 sends a sampling clock signal to ADC 16 in response to initiation by the trigger pulse after being enabled by the start acquisition signal. The sampling clock is counted by an address counter within time base control circuit 18. The address counter may be preset with a predetermined number to provide either pre-trigger or post-triggered operation in the well-known manner. The n-bit digital data is clocked into acquisition memory 28 according to addresses designated via bus 30 by the address counter, as is also well-known in the art.

When the address counter reaches a count of the maximum address, time base control circuit 18 provides an acquisition-complete signal (ACQ COMPLETE) to microprocessor 24, which in turn disables time base control circuit 18. During the high logic state of the ACQ COMPLETE signal, the acquired waveform data is transferred to display memory 32 under control of microprocessor 24 via bus 30. Microprocessor 24 reads the data from display memory 30 and processes it to measure amplitude and frequency, produce interpolated data etc. Display memory 30 is loaded with data representing a waveform by microprocessor 24. Now, microprocessor 24 is free to start another waveform acquisition and provide an acquisition start signal again to time base control circuit 18.

The stored data is clocked out of display memory 30 by display clock/address counter 34 and fed to digital-to-analog converter (DAC) 36 for converting the stored digital data to an analog signal applied to display device 38, as is well known in the art. Thus, the particular waveform event included in the fixed pattern of signals can be displayed.

FIG. 3 is a detailed schematic of one embodiment for generating a trigger holdoff signal in accordance with the present invention. The input signal is applied to a non-inserted input of comparator 40 having an inverted input receiving the trigger reference voltage preselected by potentiometer 22. Comparator 40 acts as the trigger generator of the raw trigger pulses. The raw trigger pulses are provided to a clock input of D-type flip flop (DFF) 42 and clock inputs of presettable down counters 44 and 46. DFF 42 and counters 44 and 46 respond to the positive going edge of the clock input. The raw trigger pulses are also provided to one input of OR gate 48 having the output connected to an inverted reset input ($\overline{R}$) of DFF 42. Eight bits of parallel data representing the fixed number of the triggers forming a pattern is provided to count latch circuit 50. Actually, for reasons that will become apparent, the data to be provided is the fixed number minus one. Substantially coincident with the arrival of the data, a strobe pulse edge is applied to count latch circuit 50 to latch the data. The data output of count latch circuit 50 is applied to down counters 44 and 46, which have inverted load inputs for loading the data upon load command. The load inputs are connected together to the other input of OR gate 48 and the $\overline{Q}$ output of DFF 42. Counter 46 is always enabled and sends a carry signal from the ripple carry output to enable counter 44 when the count of counter 46 reaches zero. Similarly, counter 44 sends a carry signal to the D input of DFF 42 via inverter 52.

Operation of FIG. 3 is as follows: Assuming that the fixed number of the triggers forming a pattern is five as shown in FIG. 2, the eight-bit binary data (0000 0100), equivalent to the number reduced by one count from the fixed number of the triggers, is latched in count latch circuit 50 because the count from (0000 0100) to (0000 0000) is five. In the initial state, it is assumed that the binary data is loaded into counters 44 and 46, which are loaded by the higher four bits and the lower four bits, respectively. The positive going edge of the raw trigger causes counter 46 to count down from (0100). When the count reaches (0000), counter 44 is enabled by a carry signal from counter 46. Since the preset value of counter 44 is (0000), counter 44 causes its carry signal, which is applied to the D input of DFF 42, to go high. On the next trigger positive edge, the Q and $\overline{Q}$ outputs respectively go high and low. The $\overline{Q}$ output of DFF 42 reloads the binary data to counters 44 and 46 and causes the output of OR gate 48 to go low when the raw trigger pulse goes low. DFF 42 is reset by the low output of OR gate 48. Thus, the output pulse is produced at the Q output of DFF 42 every five raw triggers. Such operation is allowed to free run independent of the acquisition system of the digital storage. To change the trigger point, the next raw trigger pulse may be selected by incrementing or decrementing the count by one, for example, within the trigger pattern under control of µP 24.

While the invention has been described in use for the digital oscilloscope, it is to be understood by those skilled in the art that the invention can be employed for an analog oscilloscope, and many changes and modifications may be made without departing from the scope and spirit of the invention.

The invention is claimed in accordance with the following:

1. An oscilloscope, comprising:
   trigger generator means for generating raw trigger signals at a predetermined point on an input signal;
   holdoff means coupled to said trigger generator means for receiving said raw trigger pulses and issuing valid trigger signals every predetermined number of raw trigger pulses; and
   a triggerable time base system coupled to said holdoff means for receiving said valid trigger signals and being triggered thereby.

2. An oscilloscope in accordance with claim 1 wherein said holdoff means comprises counting means for counting said raw trigger pulses and producing said valid trigger signals each time said predetermined number is reached.

3. An oscilloscope in accordance with claim 2 wherein said counting means comprises a presettable counter for producing a count output signal when said predetermined number minus one is reached, and a logic circuit responsive to said count output signal and the next raw trigger pulse to produce said valid trigger signal.

* * * * *